United States Patent
Robinson

(10) Patent No.: US 7,362,694 B2
(45) Date of Patent: Apr. 22, 2008

(54) PROGRAMMABLE IDENTITY OF I AND Q CHANNELS

(75) Inventor: Timothy B. Robinson, Boulder Creek, CA (US)

(73) Assignee: Broadcom Corporation, Irvine, CA (US)

( * ) Notice: Subject to any disclaimer, the term of this patent is extended or adjusted under 35 U.S.C. 154(b) by 837 days.

(21) Appl. No.: 10/846,052

(22) Filed: May 14, 2004

(65) Prior Publication Data

US 2005/0265485 A1  Dec. 1, 2005

(51) Int. Cl.
*H04J 11/00* (2006.01)
*H04B 7/216* (2006.01)
*H03H 7/30* (2006.01)

(52) U.S. Cl. .................................... 370/206
(58) Field of Classification Search ............ None
See application file for complete search history.

(56) References Cited

U.S. PATENT DOCUMENTS

| | | | | |
|---|---|---|---|---|
| 5,712,879 | A * | 1/1998 | Tatsuta et al. | 375/330 |
| 5,828,707 | A * | 10/1998 | Urabe et al. | 375/330 |
| 6,426,980 | B1 * | 7/2002 | Gorday et al. | 375/295 |
| 2002/0126764 | A1 * | 9/2002 | Murakami et al. | 375/295 |
| 2004/0037370 | A1 * | 2/2004 | Mori et al. | 375/322 |

* cited by examiner

*Primary Examiner*—Chi Pham
*Assistant Examiner*—Soon D. Hyun
(74) *Attorney, Agent, or Firm*—Garlick Harrison & Markison

(57) ABSTRACT

A multiplexing scheme to select either an I component or a Q component for input to I channel and Q channel inputs of a baseband receiver. The selection of which of the I or Q component to place on the I channel input and which other to place on the Q channel input is based on, there being a correct relationship of the I and Q components received from a RF processing stage of a wireless communication device or if the I and Q components have incorrect relationship because they are interchanged.

20 Claims, 4 Drawing Sheets

US 7,362,694 B2

PROGRAMMABLE IDENTITY OF I AND Q CHANNELS

BACKGROUND OF THE INVENTION

Technical Field of the Invention

The embodiments of the invention relate to wireless communication systems and, more particularly, to integrated circuits used in such wireless communication systems.

Description of Related Art

Communication systems are known to support wireless and wire lined communications between wireless and/or wire lined communication devices. Such communication systems range from national and/or international cellular telephone systems to the Internet to point-to-point in-home wireless networks. Generally, each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication device(s). For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For a wireless communication device to participate in wireless communications, it generally includes a built-in radio transceiver (i.e., receiver and transmitter) or is coupled to an associated radio transceiver (e.g., a station for in-home and/or in-building wireless communication networks, RF modem, etc.). As is known, the transmitter may include a data modulation stage, one or more intermediate frequency (IF) stages, and a power amplifier. The data modulation stage converts raw data into baseband signals in accordance with a particular wireless communication standard. The one or more intermediate frequency stages mix the baseband signals with one or more local oscillator signal(s) to produce RF signals. The power amplifier amplifies the RF signals prior to transmission via an antenna.

As is also known, the receiver is coupled to the antenna and may include a low noise amplifier, one or more intermediate frequency stages, a filtering stage, and a data recovery stage. The low noise amplifier receives inbound RF signals via the antenna and amplifies the signal. The one or more intermediate frequency stages mix the amplified RF signals with one or more local oscillator signal(s) to convert the amplified RF signal into baseband signals or IF signals. The filtering stage filters the baseband or IF signals to attenuate frequencies outside of the bandwidth of the filter to produce filtered signals. The data recovery stage recovers raw data from the filtered signals in accordance with the particular wireless communication standard employed.

In some signal processing techniques employed for wireless communications (e.g., differential phase shift keying (DPSK) or quadrature phase shift keying (QPSK)) a signal may be depicted using a two-dimensional constellation diagram, where the number of points on the constellation graphically represents the complex envelope of possible symbol states. The x-axis of a constellation diagram represents the in-phase (I) component of the complex modulation envelope and the y-axis represents the quadrature (Q) component of the complex modulation envelope. Generally, when signals are transmitted based on a certain constellation pattern, the transmitted intelligence may be recovered if the receiving unit is able to demodulate based on the same constellation pattern.

However, if for any reason the I and Q components are interchanged, causing the I and Q axes to flip, then in that instance the recovered data is unintelligible. Accordingly, a need exists for a technique to compensate for the I and Q axes, if a condition occurs that may cause the two axes to flip.

SUMMARY OF THE INVENTION

An apparatus and method to select in-phase and quadrature components for I and Q channel inputs of a baseband processor. In order to demodulate and recover data correctly, a converted RF signal is coupled to a baseband receiver with I and Q components. A switching circuit is utilized to switch the I and Q components onto corresponding I and Q channel inputs if the I and Q components are in correct phase. However, if the I and Q components are for some reason interchanged, then the Q component is utilized for the I channel input of the baseband receiver and the I component is utilized for the Q channel input of the baseband receiver.

In one embodiment, multiplexers are used as the switching circuit. The multiplexers may be made programmable so that the selection of inputs to the I and Q channels may be programmably controlled. In one embodiment, the programming control for the multiplexers is achieved by a value stored in a register.

Although embodiments of the invention may be applicable in various devices, one example is the implementation of the invention in a wireless communication system, in which the multiplexers reside in an integrated circuit chip that includes a baseband receiver.

DETAILED DESCRIPTION OF THE EMBODIMENTS OF THE INVENTION

Figure 1:
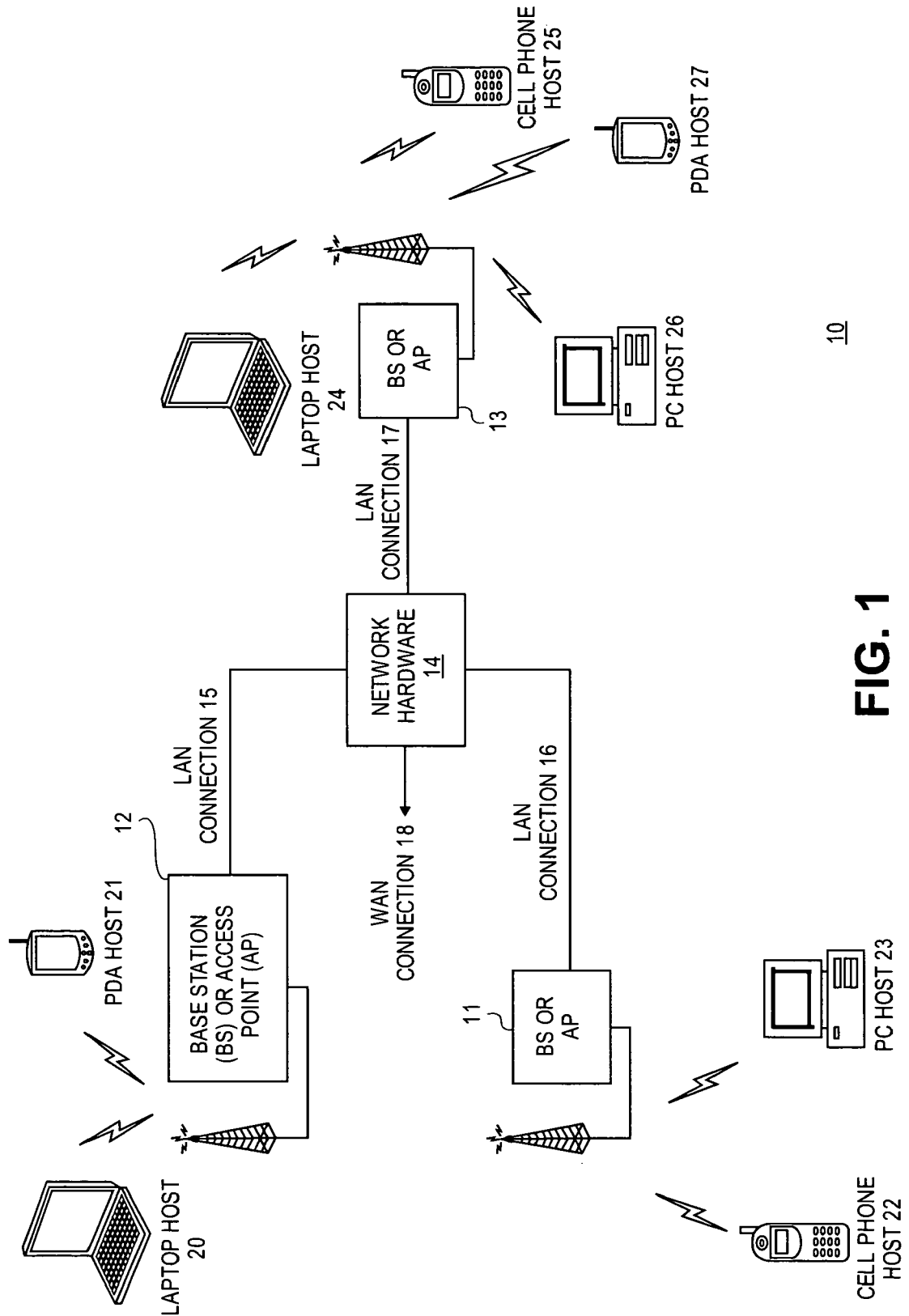
FIG. 1 is a system diagram showing a wireless communication system in which one or more devices may employ an embodiment of the present invention.

The embodiments of the present invention may be practiced in a variety of settings that implement conversion of a RF signal to recover intelligence. FIG. 1 is a schematic block diagram illustrating a communication system 10 that includes a plurality of base stations (BS) and/or access points (AP) 11-13, a plurality of wireless communication devices 20-27 and a network hardware component 14. Wireless communication devices 20-27 may be laptop host computers 20, 24, personal digital assistant hosts 21, 27, personal computer hosts 23, 26 and/or cellular telephone hosts 22, 25. Communication system 10 may include other types of devices as well.

The base stations or access points (BS/AP) 11-13 may be operably coupled to network hardware 14 via respective local area network connections 15-17. Network hardware 14, which may be a router, switch, bridge, modem, system controller, etc., may provide a wide area network connection 18 for communication system 10. Individual BS/AP 11-13 generally has an associated antenna or antenna array to communicate with the various wireless communication devices in its area. Typically, the wireless communication devices register with a particular BS/AP 11-13 to receive services within communication system 10. For direct connections (i.e., point-to-point communications), wireless communication devices may communicate directly via an allocated channel.

Typically, base stations are used for cellular telephone systems and like-type systems, while access points are used for in-home or in-building wireless networks. Regardless of the particular type of communication system, an individual wireless communication device includes a built-in radio and/or is coupled to a radio. The radio may include a linear amplifier and/or programmable multi-stage amplifier to enhance performance, reduce costs, reduce size, and/or enhance broadband applications. It is to be noted that an embodiment of the invention may be implemented in one or more of the various units 11-13 and/or 20-27 of FIG. 1.

Figure 2:
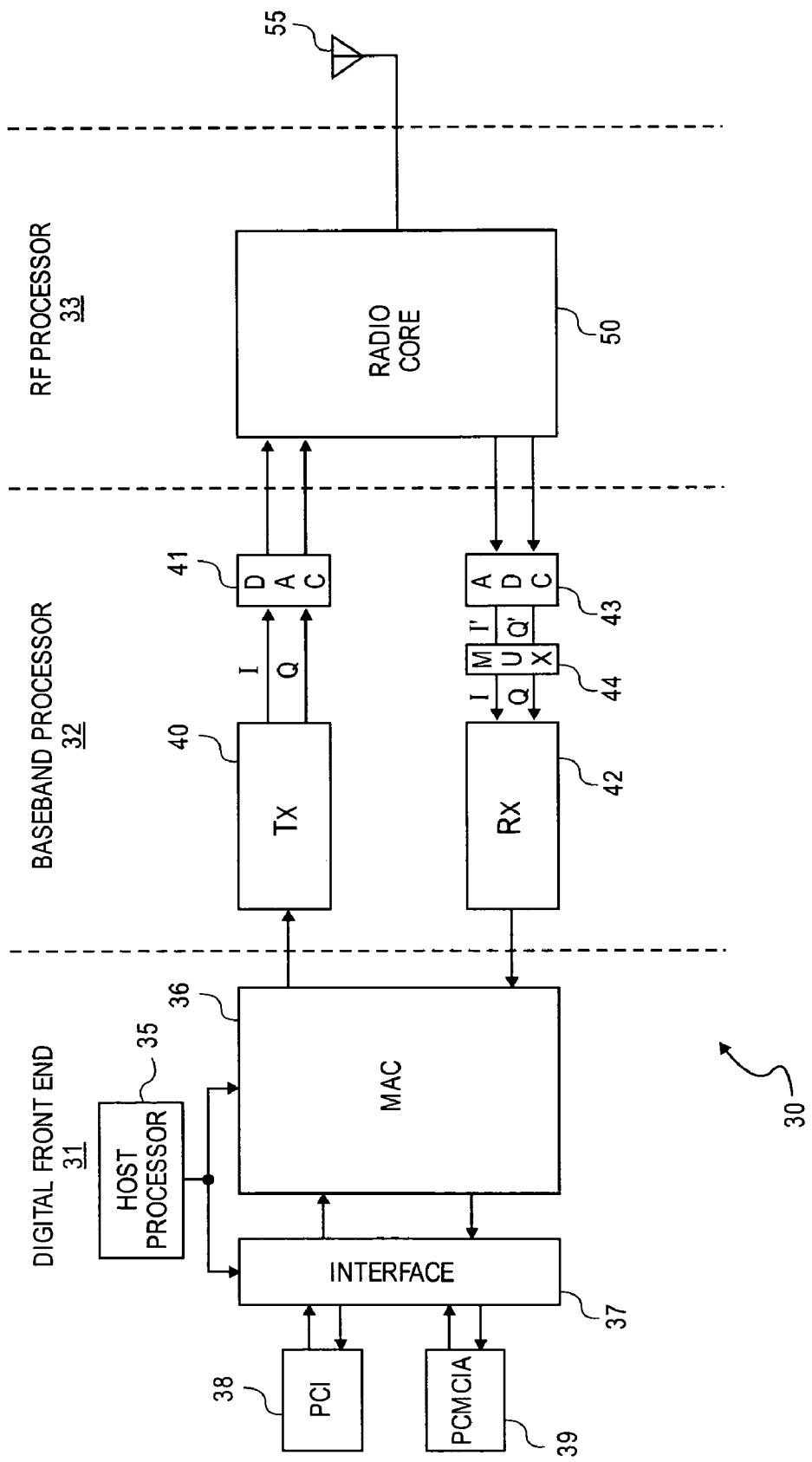
FIG. 2 is a block schematic diagram showing portions of a device utilized for wireless communication, in which an embodiment of the present invention is implemented in a baseband processor portion of the device.

FIG. 2 is a schematic block diagram illustrating an example embodiment of a device 30 that may be readily implemented in one or more of the wireless communication devices 20-27, as well as in BS/AP 11-13. Generally, for cellular telephone hosts, device 30 is a built-in component. For personal digital assistants hosts, laptop hosts, and/or personal computer hosts, device 30 may be built-in or may be an externally coupled component.

As shown in the embodiment of FIG. 2, device 30 includes a digital front end 31, baseband processor 32 and radio frequency (RF) processor 33. Digital front end 31 may be comprised of a variety of devices and circuits to process signals and interact with a user. Generally, a user inputs data through a keyboard, keypad, microphone, etc. and obtains data output through a visual display, speaker, headphone, etc. Data to be transmitted from device 30 is first processed by the digital front end 31 and sent as digital data to baseband processor 32. Likewise, in a receive mode, digital data output from baseband processor 32 is coupled to digital front end 31 to be processed for use by the user.

In the example device 30, digital front end 31 includes a host processor 35, media access control (MAC) unit 36, interface 37 and one or more input/output (I/O) connections. In the particular example device 30, Peripheral Component Interconnect (PCI) connection 38 and Personal Computer Memory Card International Association (PCMCIA) connection 39 are shown as just two examples of the I/O interfaces available. It is to be noted that other connection and bus standards may be used to provide coupling to the interface 37.

MAC unit 36 generally provides the node address(es) for various nodes on the network, if device 30 is coupled onto a network. A host processor 35 may be present to control the operation of digital front end 31 and/or to process incoming and/or out-going data, if such data processing is needed prior to inputting data to baseband processor 32 and/or outputting data to the user. Therefore, in a typical operation, data input from a user is received by digital front end 31 and sent to baseband processor 32 when data is ready to be transmitted. Similarly, when data is received by wireless communication, the digital data output from baseband processor 32 is coupled to digital front end 31 to be made available for use by the user. It is to be noted that other embodiments for the digital front end may include additional components, such as memory, processing modules or other interfaces. Furthermore, digital front end 31 may be part of a stand alone device, so that coupling to a network may not be needed. In other instances, the digital front end may perform corresponding communication functions in accordance with a particular standard, such as a cellular telephone standard.

Baseband processor 32 includes a transmitting (Tx) module 40 to receive digital data from digital front end 31 and process the digital data for conversion as outbound signals to RF processor 33. Likewise, baseband processor 32 also includes a receiving (Rx) module 42 to receive inbound signals from RF processor 33 and convert the inbound signals as digital data for output to digital front end 31. In the particular embodiment shown for baseband processor 32, Tx module 40 resides in the transmitting path and converts the digital signal from digital front end 31 to an in-phase component I and quadrature component Q pursuant to a known digital modulation technique. The outbound I and Q components are then coupled to a digital-to-analog converter (DAC) 41 to convert the digital component signals into analog signals. The Q and I analog components are then coupled to RF processor 33 as modulation signals. It is to be noted that DAC 41 may be comprised of one or more DAC units to provide the digital-to-analog conversion.

On the receiving path, the inbound RF signals are converted into Q' and I' components in RF processor 33 and coupled to an analog-to-digital converter (ADC) 43 for conversion to digital signals as part of demodulation. ADC 43 may be comprised of one or more ADC units to provide the analog-to-digital conversion. The digital Q' and I' components are then coupled to Rx module 42 through a multiplexer (MUX) 44. As will be described below, a function of MUX 44 is to select which one of the I' or Q' component to be used for the in-phase component I channel input to Rx module 42 and which other Q' or I' component to be used for the quadrature component Q channel input to Rx module 42. Although a multiplexer is shown, it is to be noted that other switching devices may be utilized for the Q' and I' selection input to Rx module 42. Rx module 42 receives the Q and I digital components and combines the components to generate a digital signal for output to the digital front end 31.

It is to be noted that a variety of circuitry may be utilized for Tx and Rx modules to perform the Q and I component conversions, including circuitry known in the art. Furthermore, although not shown, other components may be resident in baseband processor 32, such as memory. What is to be noted is that the Tx module receives digital data from the digital front end and Q and I components are generated from the performed conversion in the Tx module. Likewise, in the receiving path, the Rx module receives the Q and I components and performs the conversion to generate a digital data output to the digital front end.

RF processor 33 includes a radio core 50 for transmitting and receiving modulated RF signals. Radio core 50 receives the analog signal from baseband processor 32 and after filtering, uses the analog signal to modulate a signal envelope at a higher frequency, generally referred to as RF. A variety of modulation techniques may be employed, including modulation techniques known in the art. The baseband frequency may be converted directly to RF or one or more intermediate frequency (IF) conversion stage(s) may be employed. A typical technique is to employ a local oscillator and a mixer to perform the up-conversion operation to generate a modulated RF envelope. The RF signal is typically amplified and transmitted from an antenna 55.

Radio core 50 also receives RF signals through antenna 55 and employs a technique in reverse to demodulate a baseband signal from the received RF signal. Again, one or more IF conversion stages may be employed with a local oscillator, if direct conversion from RF to baseband frequency is not used. A low noise amplifier may be employed to amplify the received RF signal prior to demodulation. A variety of conversion techniques may be employed, including conversion techniques known in the art. The baseband components are then output to baseband processor 32.

It is to be noted that various other components may be employed within radio core 50 to perform functions for modulation and demodulation. These components may include memory components, various filters (such as low-pass filters), low noise amplifiers to increase the gain of the received signal, power amplifiers to boost the power of the transmitted signal, local oscillators and mixers to perform the frequency conversion, as well as a switching controller at the antenna to switch between transmit and receive modes. Generally, a single antenna may be utilized. However, in other embodiments, separate antennae may be used for transmitting and receiving.

It is also to be noted that Tx and Rx units 40, 42 of baseband processor 32 may also perform one or more operations including, constellation mapping/demapping, encoding/decoding, scrambling/unscrambling, as well as further frequency conversion. Generally, a particular wireless communication standard (e.g., IEEE 802.11 Bluetooth, etc.) is employed by the Tx and Rx units. The Tx and Rx units may be separate units or may employ shared units.

Furthermore, it is to be noted that device 30 of FIG. 2 may be implemented using one or more integrated circuits (ICs). For example, the digital front end may be implemented on one integrated circuit (IC), baseband processor 32 on another IC and RF processor 33 on still another IC. Alternatively, two of the units 31, 32, 33 or even all three of the units may be combined in the same IC. In some instances, external components (e.g., external memory) may be utilized in the operation of device 30.

Figure 3:
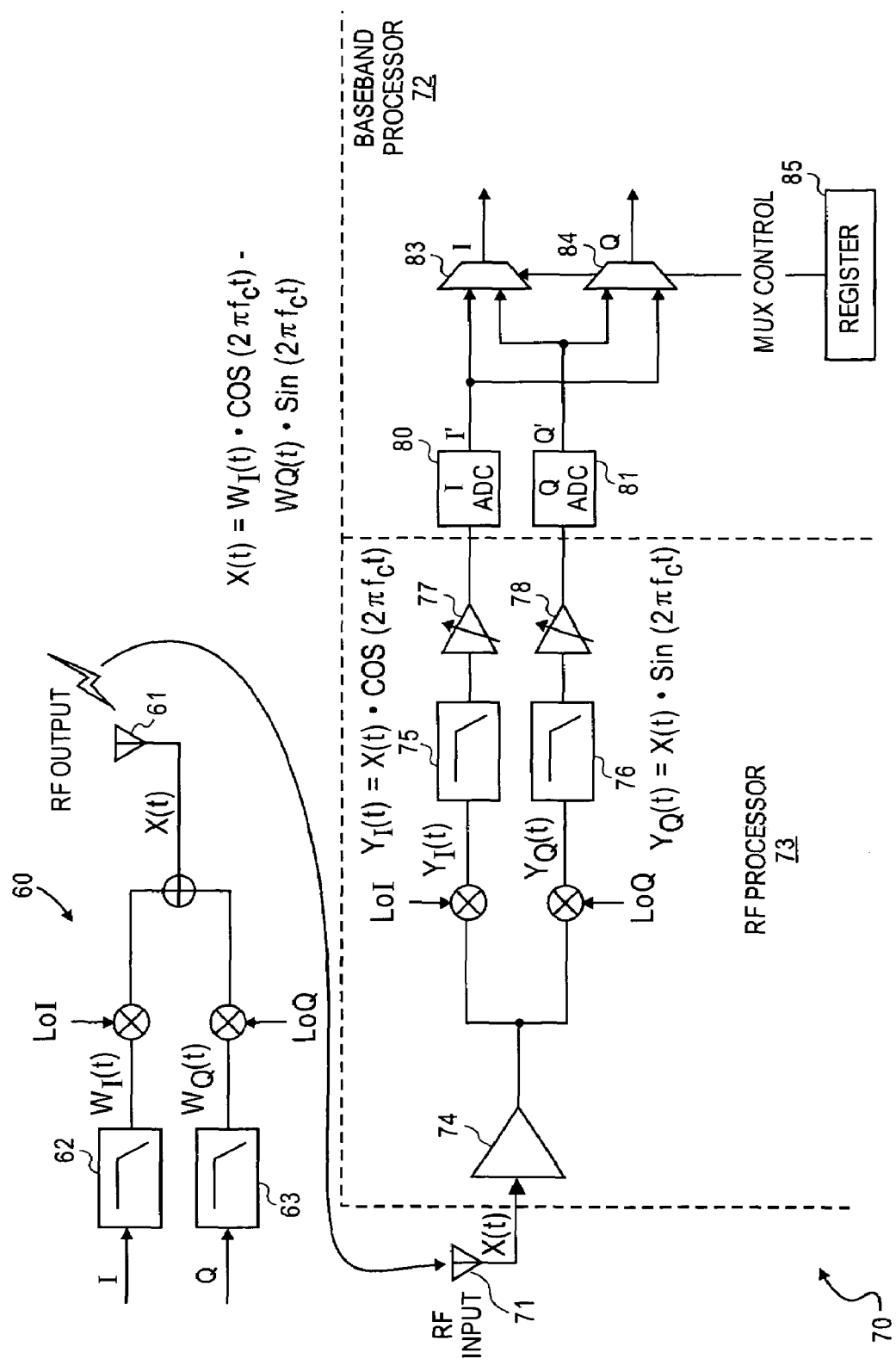
FIG. 3 is a circuit schematic diagram showing a transmission and reception of a signal and a selection of converted signals for output onto correct I and Q channels of the baseband processor by operation of multiplexers as one embodiment for practicing the present invention.

FIG. 3 illustrates one example embodiment for practicing the invention. Upper portion of FIG. 3 shows a portion of a RF section 60 utilized to transmit a signal X(t) at antenna 61. A variety of devices may be utilized to generate the I and Q components, which are then processed by RF section 60. The I and Q components are passed through corresponding filters 62, 63 and the output of the filters are noted as signals $W_I(t)$ and $W_Q(t)$. The filters 62, 63 may have various characteristics, but in one embodiment, filters 62, 63 are low-pass filters which attenuate the higher frequencies.

Subsequently, signal $W_I(t)$ is mixed with a local oscillator signal LoI to generate $W_I(t) \cos(2\pi f_c t)$. The signal $W_Q(t)$ is mixed with a local oscillator signal LoQ, which has a 90 degree phase shift from LoI, to generate $W_Q(t) \sin(2\pi f_c t)$. The summation of the two modulated signals produce an RF output X(t) at antenna 61, where $X(t)=W_I(t) \cos(2\pi f_c t) - W_Q(t) \sin(2\pi f_c t)$. When using various coded standards, such as for example, differential phase shift keying (DPSK) or quadrature phase shift keying (QPSK), the intelligence is carried in the sideband(s) and not in the carrier ($f_c$).

The transmitted RF is received by a wireless receiver unit 70. The signal X(t) is received at antenna 71 and coupled to a receiver section of an RF processor 73. In one embodiment, RF processor 73 is equivalent to RF processor 33 of FIG. 2. The received RF signal X(t) is amplified by amplifier 74 and converted by mixing with a local oscillator signal. As was performed with the transmission of the original signal, local oscillator signal LoI is used to mix with X(t) to generate $Y_I(t)$. Local oscillator signal LoQ, which has a 90 degree phase shift from LoI, is used to mix with X(t) to generate $Y_Q(t)$. The $Y_I(t)$ and $Y_Q(t)$ signals are fed through respective filters 75, 76 and respective power gain amplifiers 77, 78, prior to being output to a baseband processor 72. Filters 75, 76 are typically low-pass filters and amplifiers 77, 78 may be adjustable.

The converted analog signals are then coupled to baseband processor 72. In one embodiment, baseband processor 72 is equivalent to baseband processor 32 of FIG. 2. The $Y_I(t)$ and $Y_Q(t)$ outputs are respectively coupled to ADC 80 and ADC 81 for conversion from analog to digital format. The output from ADC 80 (I-ADC) is noted as I' and the output from ADC 81 (Q-ADC) is noted as Q' in FIG. 3.

Typically, for proper operation of baseband processor 72, baseband processor 72 expects the $Y_I(t)$ component to be the in-phase component I. That is, $Y_I(t)$ component is expected to be $X(t) \cos(2\pi f_c t)$ when converted in RF processor 73 and output to ADC 80. Likewise, $Y_Q(t)$ component is expected to be $X(t) \sin(2\pi f_c t)$ when converted in RF processor 72 and output to ADC 81. There is a 90 degree phase difference between the two components, due to the operation of the LoQ. However, in some instances, the expected Q' and I' components from RF processor 73 may not be in correct phase relationship for input into respective Q and I channels of the receiver.

Figure 4:
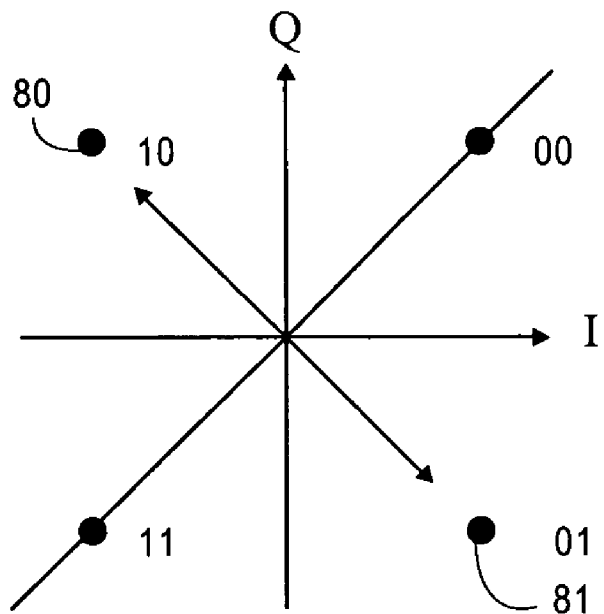
FIG. 4 is a constellation map showing the effect on the constellation when the axes are interchanged.
Figure 5:
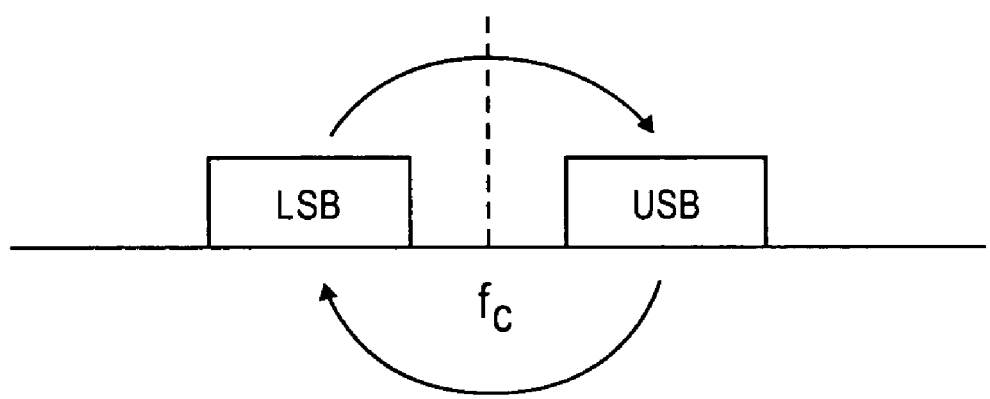
FIG. 5 illustrates flipping of upper and lower sidebands, when the constellation axes are interchanged.

FIGS. 4 and 5 illustrate a situation when Q and I components are interchanged for any reason. During conversion in the RF processor, if an unwanted interchange of Q and I components occurs, then this may result in a reflection of the constellation points in a line through the origin at 45 degrees. For example, in FIG. 4, data point 80 may be exchanged with data point 81. When certain standards are used, such as quadrature phase shift keying (QPSK), differential quadrature phase shift keying (DQPSK), direct sequence spread spectrum QPSK (DSSS-QPSK), direct sequence spread spectrum DQPSK (DSSS-DQPSK) complementary coded keying (CCK) and/or orthogonal frequency division multiplexing (OFDM), an interchange of the Q and I components results in the flipping of the sidebands as shown in FIG. 5. In that instance, the attempted recovery of data results in unintelligible or corrupted data. In the example shown in FIG. 4, the data value "01" is read as "10" and vice versa.

In order to adjust for the situation when an unwanted exchange of the I' and Q' components occurs, an embodiment of the invention shown in FIGS. 3 uses MUXs to select the appropriate outputs to the I and Q channels of the receiver. In FIG. 3, a MUX 83 receives the I' and Q' outputs from ADCs 80, 81 and selects one as the correct I output. Likewise MUX 84 receives the same I' and Q' outputs from ADCs 80, 81 and selects the other output as the correct Q output. For example, when I' and Q' outputs are appropriately in the correct phase, MUX 83 selects I' for the I channel and MUX 84 selects Q' for the Q channel. However, if there is an unwanted exchange of the constellation mapping, then MUX 83 selects and outputs Q' for the I channel and MUX 84 selects and outputs I' for the Q channel of the baseband processor. Thus, by utilizing the MUXs 83, 84, an unwanted exchange of I and Q components in the incoming signal may be corrected to ensure a correct I and Q channel correspondence of the signal components for processing by baseband processor 72.

It is to be noted that the MUXs 83, 84 correspond to the MUX 44 of FIG. 2 in one embodiment for practicing the invention. Thus, even if the I'/Q' components are reversed, the operation of the MUX(s) ensures that Rx module 42 receives the correct I and Q phasing for the I and Q channels. It is also to be noted that even though MUXs are shown, other switching devices or circuits may be utilized to select between the I' and Q' outputs.

Although a variety of MUX switching control techniques may be utilized, in the embodiment of FIG. 3, MUX control is provided by a value stored in a storage device, such as a register 85. By programming the value stored in register 85, appropriate selection of the I' and Q' signals from MUXs 83, 84 as I and Q channel inputs may be made.

As one example, if the RF processor 73 and baseband processor 72 are separate IC chips, it is possible that a situation may occur where RF processor 73 may be replaced with another. Such a condition may occur if an enhanced RF IC chip is available for replacing an older chip on a board. If the circuit characteristics of the new RF processor unit reverses the interpretation of the I and Q components, then the baseband unit can readily adjust for the new RF IC by programming register 85 to select the Q' output for the I channel and I' output for the Q channel. Without this selectability, significant circuit adjustment may be needed or even the replacement of the baseband unit itself. Thus, MUX 83, 84 allow flexibility in adjusting for circuit changes in the design of wireless device 70 by selecting appropriate signals for the I and Q channels. In one embodiment, this flexibility is made programmable.

I claim:

1. An apparatus comprising:
   a receiver to receive converted radio frequency (RF) signals having an in-phase component I and a quadrature component Q to recover data from a demodulated signal;
   an analog-to-digital converter (ADC) coupled to receive and convert the component I and component Q to digital I and Q components; and
   a switching circuit coupled to the ADC to select between the digital I and Q components to have the digital I component for input into an I channel input of a baseband processor and to have the digital Q component for input into a Q channel input of the baseband processor when the I and Q components are in correct phase relationship on a signal constellation map, but to select the digital Q component for input into the I channel input of the baseband processor and digital I component for input into the Q channel input of the baseband processor when the I and Q components are interchanged relative to their correct relationship.

2. The apparatus of claim 1, wherein the switching circuit comprises at least one multiplexer.

3. The apparatus of claim 1, wherein the switching circuit comprises a first multiplexer to select one of the digital I or Q components for the I channel input to the baseband processor and a second multiplexer to select the other of the digital Q or I components for the Q channel input to the baseband processor.

4. The apparatus of claim 1 further including a storage medium to store a value to set selection control for the switching circuit.

5. The apparatus of claim 1 further including a register to store a programmable value to set selection control for the switching circuit.

6. An integrated circuit comprising:
   an analog-to-digital converter (ADC) to couple to a radio frequency (RF) processor to receive converted analog signals from the RF processor, the converted analog signals having an in-phase component I and a quadrature component Q, and to convert the analog I and Q components to digital I and Q components;
   a switching circuit coupled to the ADC to select between the digital I and Q components to have the digital I component for input into an I channel input of a baseband processor and to have the digital Q component for input into a Q channel input of the baseband processor when the I and Q components are in correct phase relationship on a signal constellation map, but to select the digital Q component for input into the I channel input of the baseband processor and digital I component for input into the Q channel input of the baseband processor when the I and Q components are interchanged relative to their correct relationship.

7. The integrated circuit of claim 6 further including a baseband processor to recover data from a demodulated signal by utilizing the digital I and Q components.

8. The integrated circuit of claim 7, wherein the switching circuit comprises a first multiplexer to select one of the digital I or Q components for the I channel input to the baseband processor and a second multiplexer to select the other of the digital Q or I components for the Q channel input to the baseband processor.

9. The integrated circuit of claim 8, wherein the integrated circuit is to be utilized in wireless communication.

10. The integrated circuit of claim 8 further including a storage medium to store a value to set selection control for the multiplexers.

11. The integrated circuit of claim 8 further including a register to store a programmable value to set selection control for the multiplexers.

12. A method comprising:
   receiving an in-phase component I and a quadrature component Q as converted RF signals;
   selecting the in-phase component for input into an I channel input and quadrature component for input into a Q channel input to obtain a demodulated signal, if the in-phase and quadrature components are in correct phase relationship on a signal constellation map; and selecting the in-phase component for input into the Q channel input and quadrature component for input into the I channel input to recover data from a demodulated signal, if the in-phase and quadrature components are interchanged relative to their correct relationship.

13. The method of claim 12 further including converting the RF signals into digital I and Q components prior to selecting the components for input into I and Q channel inputs.

14. The method of claim 13 wherein the selecting the two components for input into I and Q channel inputs is programmable.

15. The method of claim 13, wherein receiving the I and Q components receives by utilizing one or more standards of quadrature phase shift keying (QPSK), differential quadrature phase shift keying (DQPSK), direct sequence spread spectrum QPSK (DSSS-QPSK), direct sequence spread spectrum DQPSK (DSSS-DQPSK), complementary coded keying (CCK) and orthogonal frequency division multiplexing (OFDM).

16. A method comprising:
receiving a radio frequency (RF) signal in a wireless transmission;
converting the RF signal to generate an in-phase component I and a quadrature component Q in analog format;
converting the I and Q components to digital format;
selecting the in-phase component for input into an I channel input and quadrature component for input into a Q channel input to recover data from a demodulated signal, if the in-phase and quadrature components are in correct phase relationship on a signal constellation map;
selecting the in-phase component for input into the Q channel input and quadrature component for input into the I channel input to obtain a demodulated signal, if the in-phase and quadrature components are interchanged relative to their correct relationship; and
recovering data at a baseband frequency.

17. The method of claim 16, wherein the selecting the two components for input into I and Q channel inputs is programmable.

18. The method of claim 17 is used to flip lower and upper sidebands in the received wireless transmission.

19. The method of claim 18, wherein receiving the I and Q components receives by utilizing one or more standards of quadrature phase shift keying (QPSK), differential quadrature phase shift keying (DQPSK), direct sequence spread spectrum QPSK (DSSS-QPSK), direct sequence spread spectrum DQPSK (DSSS-DQPSK), complementary coded keying (CCK) and orthogonal frequency division multiplexing (OFDM).

20. The method of claim 16, wherein receiving the I and Q components receives by utilizing one or more standards of quadrature phase shift keying (QPSK), differential quadrature phase shift keying (DQPSK), direct sequence spread spectrum QPSK (DSSS-QPSK), direct sequence spread spectrum DQPSK (DSSS-DQPSK), complementary coded keying (CCK) and orthogonal frequency division multiplexing (OFDM).

* * * * *